United States Patent
Dyer et al.

(10) Patent No.: US 7,390,745 B2
(45) Date of Patent: Jun. 24, 2008

(54) PATTERN ENHANCEMENT BY CRYSTALLOGRAPHIC ETCHING

(75) Inventors: Thomas W. Dyer, Pleasant Valley, NY (US); Kenneth T. Settlemyer, Jr., Bradenton, FL (US); James J. Toomey, Poughkeepsie, NY (US); Haining Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 11/162,800

(22) Filed: Sep. 23, 2005

(65) Prior Publication Data

US 2007/0072429 A1    Mar. 29, 2007

(51) Int. Cl.
*H01L 21/302* (2006.01)
*H01L 21/461* (2006.01)

(52) U.S. Cl. ............... 438/689; 216/39; 216/99; 438/700; 438/705; 438/717; 438/719; 438/734; 438/745

(58) Field of Classification Search .......... 438/689
See application file for complete search history.

(56) References Cited

U.S. PATENT DOCUMENTS

| | | | | |
|---|---|---|---|---|
| 4,454,646 A | * | 6/1984 | Joy et al. | 438/361 |
| 4,690,729 A | * | 9/1987 | Douglas | 438/695 |
| 5,030,590 A | * | 7/1991 | Amini et al. | 438/669 |
| 5,583,368 A | * | 12/1996 | Kenney | 257/621 |
| 6,180,533 B1 | * | 1/2001 | Jain et al. | 438/714 |
| 6,291,353 B1 | * | 9/2001 | Muller et al. | 438/700 |
| 6,517,735 B2 | * | 2/2003 | Trueba et al. | 216/27 |
| 6,809,033 B1 | * | 10/2004 | Hui et al. | 438/694 |
| 2002/0127831 A1 | * | 9/2002 | Hadizad et al. | 438/510 |

OTHER PUBLICATIONS

Namatsu et al. (Influence of edge roughness in resist patterns on etched patters; 1998).*
Mallinckrodt Baker, Inc. (MSDS: No. A5916; Ammonium Hydroxide; Oct. 2002).*
Wolf et al. (Silicon Processing for the VLSI Era; vol. 1; 1999; Lattice Press).*
Dang et al. (Sub-150 nm, high-aspect-ration features using near-field phase-shifting contact lithography; Received May 28, 2002; accepted Mar. 31, 2003; published May 27, 2003; Journal of Vacuum Science & Technology: Microelectronics and Nanometer Structures—May 2003—vol. 21, Issue 3, pp. 1143-1148).*

* cited by examiner

*Primary Examiner*—Nadine Norton
*Assistant Examiner*—Patricia A. George
(74) *Attorney, Agent, or Firm*—Scully, Scott, Murphy & Presser, P.C.; H. Daniel Schnurmann

(57) ABSTRACT

A method for producing predetermined shapes in a crystalline Si-containing material that have substantially uniform straight sides or edges and well-defined inside and outside corners is provided together with the structure that is formed utilizing the method of the present invention. The inventive method utilizes conventional photolithography and etching to transfer a pattern, i.e., shape, to a crystalline Si-containing material. Since conventional processing is used, the patterns have the inherent limitations of rounded corners. A selective etching process utilizing a solution of diluted ammonium hydroxide is used to eliminate the rounded corners providing a final shape that has substantially straight sides or edges and substantially rounded corners.

14 Claims, 2 Drawing Sheets

PATTERN ENHANCEMENT BY CRYSTALLOGRAPHIC ETCHING

FIELD OF THE INVENTION

The present invention relates to semiconductor device manufacturing, and more particularly to a method for enhancing the patterning of crystalline Si-containing materials using crystallographic etching. The present invention also relates to a semiconductor structure which includes a patterned crystalline Si-containing material having substantially square corners.

BACKGROUND OF THE INVENTION

Photolithography (which may also be referred to as just 'lithography') is a well-known technique used in semiconductor device fabrication to provide three-dimensional patterns (or shapes or features) to a semiconductor structure. The terms "patterns", "shapes" and "features" are interchangeably used in the present application. The three-dimensional patterns may be located within a semiconductor substrate itself or they can be formed on a surface of a semiconductor substrate. Photolithography generally includes the steps of applying a photoresist material to a surface of a structure having at least one material layer that needs patterning, exposing the applied photoresist material to a pattern of radiation and developing the pattern into the photoresist material utilizing a resist developer. The pattern in the photoresist is then transferred to the underlying material layer(s) of the semiconductor structure utilizing an etching process such as reactive-ion etching, ion beam etching, plasma etching or laser ablation. Depending on the material layer(s) being etched, the remaining photoresist can be removed prior to or after the etching process.

The patterns provided by photolithography are three-dimensional in that they have a width, height and length associated therewith. Examples of three-dimensional patterns that can be formed utilizing photolithography include, but are not limited to: trenches for isolation regions, vias and lines for device metallization, and gate stacks for field effect transistor fabrication.

One major drawback with conventional photolithographic processes in patterning crystalline materials is that the patterning of features that are comparable in scale to the wavelength of exposure radiation in such crystalline materials is limited by diffraction and interference effects. Optical proximity constraint (OPC) techniques can help to mitigate these effects, but fundamental limitations remain in how sharply these features can be defined. In particular, the corners of such features tend to be rounded with a radius on the order of the light wavelength. This rounding can limit circuit density since key material layers must be overlaid in a way that avoids these corners.

FIG. 1 shows a fragment of a typical pattern that is formed into a crystalline Si-containing material. As shown, prior art photolithographic processes provide a patterned region 100 that has rounded internal and external corners 102A and 102B, respectively. When polygates 104A and 104B are formed over the patterned region 100, the channel widths of these devices vary. In particular, polygate 104A has a wider channel width 106A at the internal corner 102A than the channel width of polygate 104B at the external corner 102B.

In view of the above, a method is needed which overcomes the problems with prior art photolithographic processes, particularly corner rounding. In particular, a method is provided in which the ideal structure shown in FIG. 2 is provided. The ideal structure shown in FIG. 2, which is achieved utilizing the method of the present invention, includes a crystalline Si-containing material that has shapes which have uniformly straight sides or edges and well-defined corners, i.e., corners that are substantially square, i.e., orthogonal. By 'substantially square', it is meant that the shapes provided in the crystalline Si-containing material by the present invention have wall portions that are at 90° to each other, as seen in a top view, for example, the view illustrated in FIG. 2.

SUMMARY OF THE INVENTION

The present invention provides a method for producing shapes, preferably electrically active area shapes, in a crystalline Si-containing material that have substantially uniform straight sides or edges and well-defined corners. By "substantially straight" it is meant that there is little or no thickness variation in the remaining patterned crystalline Si-containing material. By "well-defined" it is meant shapes in which the corners (e.g., inside and outside) are not rounded, i.e., the corner radius requirement would be proportionally sharp and square relative to feature sizes of the interacting features.

It is noted that the method of the present invention is especially suited for providing highly dense circuits or other areas where the proximity of semiconductor features and their inherent corner rounding due to standard semiconductor processing would degrade the quality of the intended interaction of these features. This point is now illustrated in terms of a common six transistor SRAM (static random access memory). Typically, SRAM storage devices (as well as their permutations such as, but not limited to: dual port SRAM cells, content-addressable memories (CAMs) and dynamic random access memories (DRAMs)) are designed for high-density and therefore have key feature interactions that are highly sensitive to limitations of standard Si-containing processing. Corner rounding of the active area is of prime importance and it's interaction with the overlying polygate lines can greatly affect both the device behavior and the SRAM stability. In particular, corner rounding is known to increase the width of the device and hence to affect the device performance. Moreover, when the polygate lines are formed over patterned active areas having rounded corners, its placement may not be ideal causing undesirable changes in the device characteristics.

The SRAM is merely an example of how corner rounding affects dense circuits, however, there are many other areas where locally close features may be found in random logic.

In general terms, the method of the present invention includes the steps of: providing a photoresist over a crystalline Si-containing material; lithographically patterning at least one predetermined shape having substantially square corners into the photoresist, wherein said patterning produces at least one predetermined shape having rounded corners into said photoresist; transferring said at least one predetermined shape having rounded corners into said crystalline Si-containing material; and selectively etching out said rounded corners to provide at least one desired shape in said crystalline Si-containing material that has substantially uniformly straight sides or edges and substantially square corners; e.g., producing shapes that are substantially sharp in internal and external corners mimicking a predetermined and desired design shape.

The present invention also relates to the semiconductor structure that is formed utilizing the method described above. Specifically, the inventive semiconductor structure comprises: a crystalline Si-containing material having at least one pattern located therein, said at least one pattern having substantially uniformly straight sides or edges and substantially square corners.

It is noted that sharp well-defined corners formed into a crystalline Si-containing material have advantages for many types of devices where dense circuitry is required. The integrity of transfer of design intent into crystalline Si-containing materials has application in any high-density complementary metal oxide semiconductor (CMOS) design and can mitigate other process limitations such as, for example, critical dimension, overlay and etch variability. Other potential applications of the inventive method may be non-electrical application of an array of Si-containing spikes which may be patterned by other techniques besides photolithography and then by utilizing the unique selective Si-containing etching step of the present invention which etches along crystallographic planes within the crystalline Si-containing material.

Other applications for the inventive method that may be appropriate are MEMs (micro mechanical machines).

DETAILED DESCRIPTION OF THE INVENTION

The present invention, which provides a method for pattern enhancement by crystallographic etching and the semiconductor structure that is formed utilizing the same, will now be described in greater detail by referring to various drawings that accompany the present application. It is noted that the drawings of the present application are provided for illustrative purposes and, as such, they are not drawn to scale.

Figure 1:
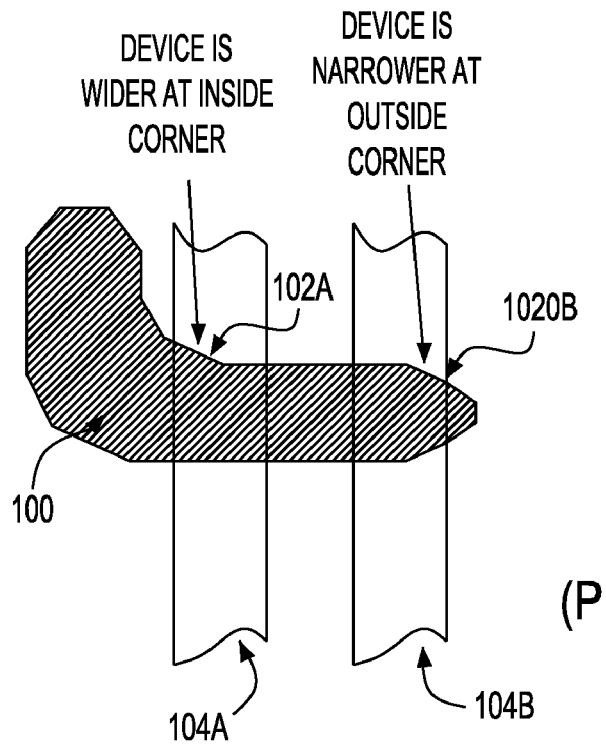
FIG. 1 is a pictorial representation (through a top-down view) illustrating a patterned crystalline Si-containing material that is made utilizing conventional photolithography and etching.
Figure 2:
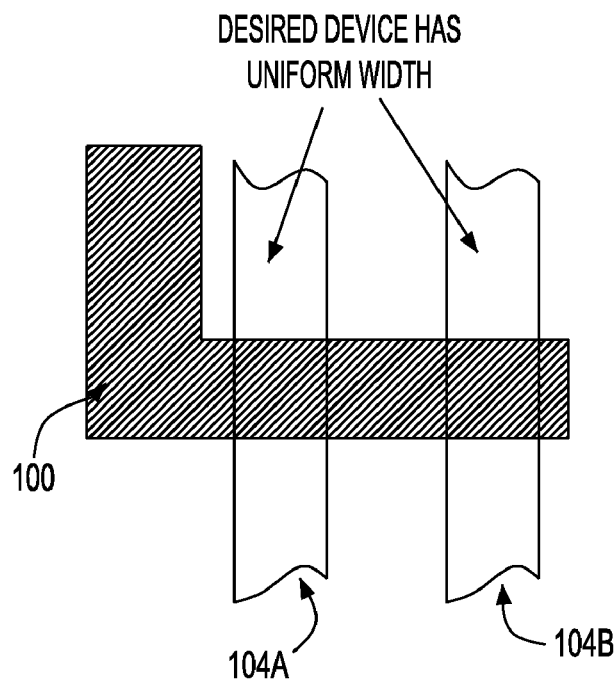
FIG. 2 is a pictorial representation (through a top-down view) illustrating an ideal patterned crystalline Si-containing material that is made utilizing the method of the present invention.

As stated above, this invention relates to a method for producing shapes, preferably electrically active area shapes, into a crystalline Si-containing material that have uniformly straight lines and well-defined corners. Specifically, the present invention provides a method in which the structure shown in FIG. 2 is formed. Reference is now made to FIGS. 3A-3C and FIG. 4 as well as the following description, which provide further details regarding the inventive method.

Figure 3A:
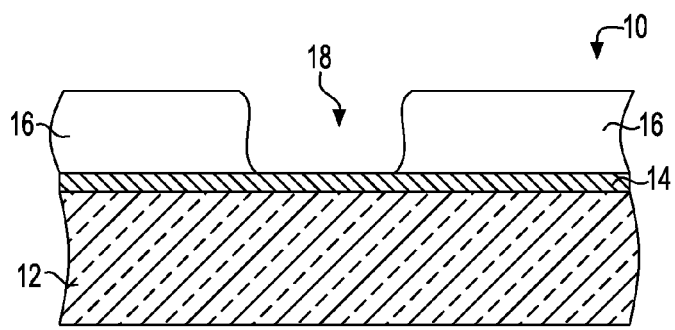
FIGS. 3A-3C are pictorial representations (through cross sectional views) illustrating the basic processing steps utilized in the present invention for providing the ideal patterned structure shown in FIG. 2.

FIG. 3A shows an initial structure 10 that can be employed in the present invention. Specifically, the initial structure 10 includes a crystalline Si-containing material 12, an optional hard mask 14 and a patterned photoresist 16 that has at least one predetermined shape 18 therein with the inherent limitations of rounded corners.

The crystalline Si-containing material 12 may be single crystalline having any major or minor Miller Index such as, for example, (110), (111) or (100). Alternatively, the crystalline Si-containing material 12 can be a polycrystalline material. In accordance with the present invention, the crystalline Si-containing material 12 may be a semiconductor substrate (i.e., wafer) or a material layer that is present atop a Si-containing or non-Si-containing semiconductor substrate. For clarity, the embodiment depicted in the present invention and shown in FIG. 3A is for the instance in which the crystalline Si-containing material 12 is a semiconductor substrate.

The term "Si-containing material" as used herein denotes polySi, polySiGe, Si, SiGe, SiC, SiGeC, silicon-on-insulators (SOI), SiGe-on-insulators (SGOI), or any other semiconductor material that includes silicon. The Si-containing material 12 may be strained, unstrained or it may contain a combination of strained and unstrained regions. The crystalline Si-containing material 12 may be doped, undoped or contain undoped and doped regions therein. The thickness of the crystalline Si-containing material 12 may vary depending on whether it is used as the substrate or a material layer located above the substrate. The crystalline Si-containing material 12 can be formed utilizing techniques well known in the art including, for example, crystal growth, crystal pulling or deposition.

In some embodiments of the present invention, an optional hard mask 14 may be formed atop the crystalline Si-containing material 12. The optional hard mask 14, which may comprise a single layer or a stack of various layers, is typically composed of an oxide, a nitride, an oxynitride or a combination thereof. Generally, the optional hard mask 14 comprises $SiO_2$, SiN or a combination thereof. The optional hard mask 14 is formed utilizing conventional techniques well known in the art. For example, the optional hard mask 14 can be formed by thermal techniques, such as, oxidization, nitridation or oxynitridation, deposition or any combination thereof. Suitable deposition techniques that can be used in forming the optional hard mask 14 include, but are not limited to: chemical vapor deposition (CVD), plasma enhanced chemical vapor deposition (PECVD), atomic layer deposition, chemical solution deposition, evaporation and other like deposition processes. The thickness of the optional hard mask 14 may vary depending upon the number of material layers present and the technique that was used in forming the same. Typically, and for illustrative purposes, the optional hard mask 14 has a thickness from about 10 to about 10,000 Å, with a thickness from about 500 to about 5000 Å being more typical.

A conventional photoresist (negative-tone or positive-tone) is then applied directly atop the surface of the crystalline Si-containing material 12, or directly atop the optional hard mask 14, if that layer is present. The photoresist is applied utilizing conventional techniques well known in the art including, for example, spin-on coating, evaporation, CVD and PECVD. The thickness of the photoresist is within ranges that are customarily used in the semiconductor industry for patterning an underlying material layer(s).

After applying the photoresist, the photoresist is subjected to a conventional photolithographic (herein after lithographic) process in which at least one predetermined shape (i.e., pattern or feature) is provided to the photoresist. The conventional lithographic process typically includes exposing the photoresist to a desired pattern of radiation and developing the exposed photoresist utilizing a conventional resist developer. The lithographic process provides patterned photoresist 16 having at least one predetermined shape 18 formed therein. Since conventional lithography is used in patterning the shapes into the photoresist, the at least one predetermined shape 18 formed into the photoresist contains inherently rounded corners. It is noted that the rounded corners are emphasized in the side-view shown in FIG. 3A. As shown, the rounded corners are present along the top surface of the predetermined shape and along the bottom wall of the predetermined shape.

The at least one predetermined shape 18 may be a trench, a via, an aperture, an opening or any other shape that can be subsequently formed into the crystalline Si-containing material 12. The corners are formed at the intersection of remaining portions of the Si-containing material 12, i.e., at the intersection of wall portions of the shapes with the remaining Si-containing material.

Typically, and for the embodiment illustrated, the at least one predetermined shape 18 is a trench. The trench can be used as an isolation region in the Si-containing material 12 or as an opening for a device, such as an opening for a trench capacitor.

After patterning the photoresist, the at least one predetermined shape 18 is transferred to the underlying layer(s), e.g., the crystalline Si-containing material itself, or both the crystalline Si-containing material and the optional hard mask, utilizing one or more etching processes. When the optional hard mask 14 is present, the at least one predetermined shape 18 can be first transferred to the hard mask 14 and then into the crystalline Si-containing material 12. In some instances, the patterned photoresist 16 can be removed from the structure once the at least one predetermined shape 18 is transferred to the hard mask 14. In other cases, the patterned photoresist 16 may remain on the structure until after the at least one shape 18 has been transferred to the crystalline Si-containing material 12. At that time, the patterned photoresist 16 can be removed from the structure. In either case, the removal of the patterned photoresist is achieved utilizing a conventional resist stripping process.

The one or more etching processes may comprise a wet etching process, a dry etching process or a combination thereof. When a wet etching process is used, a chemical etchant that is selective for removing Si is typically used. For example, $HNO_3$, HF or a mixture thereof can be used as the chemical etchant. When a dry etch process is used, reactive-ion etching (RIE), ion beam etching, plasma etching or laser ablation can be used. Typically, RIE is used in transferring the at least one predetermined shape 18 to the Si-containing material 12. The RIE or any other dry etching process is typically selective for removing Si.

Following the transfer of the at least one predetermined shape 18 to the crystalline Si-containing material 12 and the subsequent removal of the patterned photoresist 16, the remaining hard mask 14 can be removed utilizing a conventional planarization process such as chemical mechanical polishing (CMP) and/or grinding.

Figure 3B:
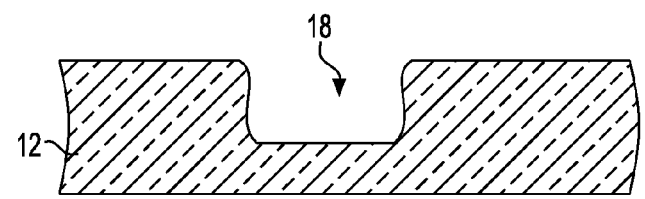

The resultant structure that is formed after pattern transfer and removal of the patterned photoresist 16 and the remaining hard mask 18, if present, is shown in FIG. 3B. It is emphasized that the at least one predetermined shape 18 formed into the crystalline Si-containing material 12 at this point of the present invention contains the inherent limitations of rounded corners as well.

Figure 3C:
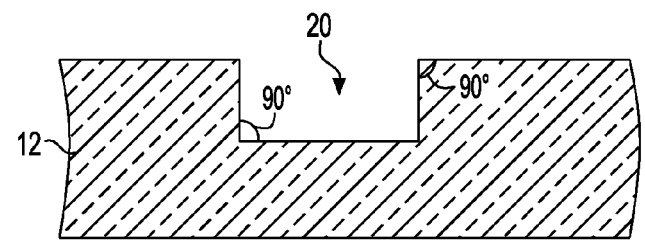

FIG. 3C shows the structure after performing an etching process that selectively etches out the rounded corners from the at least one predetermined shape 18 providing at least one desired shape 20 that has uniformly straight sides or edges and well-defined, i.e., substantially square, corners. The selective etching process used in the present invention is a crystallographic etching step that etches along the different crystallographic planes of the Si-containing material 12. Specifically, the selective etching process used in this step of the present invention comprises a dilute solution of ammonium hydroxide. Typically, a protic solvent such as, for example, distilled (or deionized) water, is used in making the dilution. Other protic solvents that can be used in the present invention include, for example, straight chain or branched alcohols containing from 1 to about 12 carbon atoms.

The etching solution used in eliminating the rounded corners comprises from about 95% or less ammonium hydroxide, with about 10 to about 75% ammonium hydroxide being more typical. This etching step is performed at temperature from about 25° to about 100° C., with a temperature from about 45° to about 65° C. being more typical. The etching time for corner 'smoothing' (i.e., elimination of rounded corners) may vary depending on the degree of corner rounding present in the initial predetermined pattern and the exact etchant solution and conditions employed. Typical etching times are from about 50 to about 300 seconds. In one preferred embodiment of the present invention, the conditions of this etching step comprise a diluted etchant solution comprising 37% ammonium hydroxide in distilled water and the etching temperature is from about 45° to about 55° C. for approximately 120 seconds.

Figure 4:
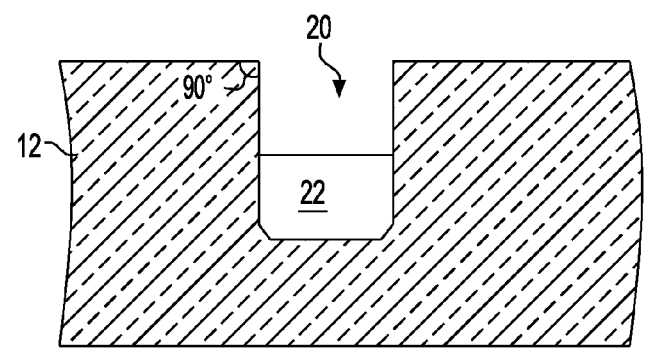
FIG. 4 is a pictorial representation (through a cross sectional view) illustrating a structure obtained utilizing an alternative embodiment in which only the top portions of the at least one shape formed into the crystalline Si-containing material is enhanced to have substantially square top corners.

FIG. 4 shows an embodiment of the present invention in which that at least one predetermined shape 18 is partially filled with a filler material 22 such as an oxide or nitride and then the selective etching process using a solution comprising diluted ammonium hydroxide is used to "smooth" the rounded corners at the top surface of the structure. The partial fill may comprises deposition and optionally recessing.

It is again noted that sharp well-defined corners formed into a crystalline Si-containing material are advantages for many types of devices where dense circuitry is required. The integrity of transfer of design intent into crystalline Si-containing materials has application in any high-density complementary metal oxide semiconductor (CMOS) design and can mitigate other process limitations such as, for example, critical dimension, overlay and etch variability. Other potential applications of the inventive method may be non-electrical application of an array of Si-containing spikes which may be patterned by other techniques besides photolithography and then by utilizing the unique selective Si-containing etching step of the present invention which etches along crystallographic planes within the crystalline Si-containing material.

While the present invention has been particularly shown and described with respect to preferred embodiments thereof, it will be understood by those skilled in the art that the foregoing changes in forms and details may be made without departing from the spirit and scope of the present application. It is therefore intended that the present invention not be limited to the exact forms and details described and illustrated herein, but fall within the scope of the appended claims.

What is claimed is:

1. A method of patterning a Si-containing material comprising:
   providing a lithographically patterned photoresist over a crystalline Si-containing material, said lithographically patterned photoresist including at least one predetermined patterned shape having at least one topographic edge that has rounded corners;
   transferring said at least one predetermined patterned shape having at least one topographic edge with rounded corners into said crystalline Si-containing material by a first etching process providing a first patterned crystalline Si-containing material including at least one patterned shape having at least one topographic edge with rounded corners; and
   removing said rounded corners of said first patterned crystalline Si-containing material utilizing a second etching process to provide a second patterned crystalline Si-containing material including at least one desired patterned shape having at least one topographic edge that has substantially uniformly straight sides or edges and substantially square corners, said second etching process comprises a crystallographic etching step that etches along different crystal planes within the crystalline Si-containing material.

2. The method of claim 1 further comprising a hard mask located on a surface of said crystalline Si-containing material and during said transferring said at least one patterned shape having at least one topographic edge with rounded corners is first formed into said hard mask.

3. The method of claim 1 wherein said providing a lithographically patterned photoresist comprises depositing a blanket layer of photoresist over the crystalline Si-containing material, exposing the photoresist to a pattern of radiation and developing the pattern into the exposed photoresist.

4. The method of claim 1 wherein said at least one predetermined patterned shape formed in said lithographically patterned photoresist is a trench pattern.

5. The method of claim 1 wherein said crystalline Si-containing material comprises polySi, polySiGe, Si, SiGe, SiC, SiGeC, a silicon-on-insulator or a SiGe-on-insulator.

6. The method of claim 1 wherein said second etching process is performed at a temperature from about 45° to about 55° C.

7. The method of claim 1 wherein said second etching process is performed utilizing a solution comprises 37% ammonium hydroxide and distilled water and at a temperature from about 45° to about 55° C.

8. The method of claim 1 wherein said second etching process comprises a solution of diluted ammonium hydroxide, said ammonium hydroxide is present in an amount from about 95% or less in said solution.

9. The method of claim 8 wherein said ammonium hydroxide is diluted with a protic solvent.

10. The method of claim 1 wherein said first etching process of said transferring is performed utilizing one or more etching steps, said one or more etching steps comprise dry etching, wet etching or a combination thereof.

11. The method of claim 10 wherein said one or more etching steps comprises drying etching.

12. The method of claim 11 wherein said dry etching comprises reactive-ion etching.

13. A method of patterning a Si-containing material comprising:

providing a lithographically patterned photoresist over a crystalline Si-containing material, said lithographically patterned photoresist including at least one predetermined patterned shape having at least one topographic edge that has rounded corners;

transferring said at least one predetermined patterned shape having at least one topographic edge with rounded corners into said crystalline Si-containing material by a first etching process providing a first patterned crystalline Si-containing material including at least one patterned shape having at least one topographic edge with rounded corners, said at least one topographic edge with rounded corners is located at an upper surface of the first patterned crystalline Si-containing material;

partially filling said at least one patterned shape having at least one topographic edge with rounded corners; and removing said rounded corners of said first patterned crystalline Si-containing material utilizing a second etching process to provide a second patterned crystalline Si-containing material including at least one desired patterned shape having at least one topographic edge that has substantially uniformly straight sides or edges and substantially square corners, said second etching process comprises a crystallographic etching step that etches along different crystal planes within the crystalline Si-containing material.

14. A method of patterning a Si-containing material comprising:

providing a lithographically patterned photoresist over a crystalline Si-containing material, said lithographically patterned photoresist including at least one predetermined patterned shape having at least one topographic edge that has rounded corners;

transferring said at least one predetermined patterned shape having at least one topographic edge with rounded corners into said crystalline Si-containing material by a first etching process providing a first patterned crystalline Si-containing material including at least one patterned shape having at least one topographic edge with rounded corners; and removing said rounded corners of said first patterned crystalline Si-containing material by utilizing a second etching process including a solution comprising diluted ammonium hydroxide to provide a second crystalline Si-containing material including at least one desired patterned shape having at least one topographic edge that has substantially uniformly straight sides or edges and substantially square corners, said second etching process comprises a crystallographic etching step that etches along different crystal planes within the crystalline Si-containing material.

\* \* \* \* \*